(12) United States Patent
Higashi et al.

(10) Patent No.: US 7,737,737 B2
(45) Date of Patent: Jun. 15, 2010

(54) DRIVE CIRCUIT FOR VOLTAGE DRIVEN ELECTRONIC ELEMENT

(75) Inventors: Kazuyuki Higashi, Yokohama (JP); Shinsuke Yonetani, Zama (JP)

(73) Assignee: Nissan Motor Co., Ltd., Yokohama-shi, Kanagawa (JP)

( * ) Notice: Subject to any disclaimer, the term of this patent is extended or adjusted under 35 U.S.C. 154(b) by 0 days.

(21) Appl. No.: 12/128,106

(22) Filed: May 28, 2008

(65) Prior Publication Data

US 2008/0303560 A1 Dec. 11, 2008

(30) Foreign Application Priority Data

Jun. 11, 2007 (JP) .............................. 2007-153615

(51) Int. Cl.
*H03K 3/00* (2006.01)
(52) U.S. Cl. ...................................... 327/112; 327/108
(58) Field of Classification Search ................. 327/108, 327/112
See application file for complete search history.

(56) References Cited

U.S. PATENT DOCUMENTS

| | | | | |
|---|---|---|---|---|
| 4,949,213 A | * | 8/1990 | Sasagawa et al. | 361/91.4 |
| 5,140,201 A | * | 8/1992 | Uenishi | 327/108 |
| 5,383,082 A | * | 1/1995 | Nishizawa | 361/93.1 |
| 5,525,925 A | * | 6/1996 | Bayer | 327/377 |
| 5,903,181 A | * | 5/1999 | Mori | 327/389 |
| 5,910,746 A | * | 6/1999 | Fordyce | 327/379 |
| 6,094,087 A | * | 7/2000 | He et al. | 327/434 |
| 6,570,405 B1 | | 5/2003 | Lien | |
| 7,109,780 B2 | * | 9/2006 | Miettinen | 327/434 |
| 7,119,586 B2 | * | 10/2006 | Hornkamp | 327/108 |
| 7,332,942 B2 | * | 2/2008 | Gotzenberger et al. | 327/109 |
| 2003/0075748 A1 | | 4/2003 | Furuie et al. | |

FOREIGN PATENT DOCUMENTS

| | | |
|---|---|---|
| EP | 0 501 481 A2 | 9/1992 |
| EP | 0 817 381 A2 | 1/1998 |
| JP | 2003-125574 A | 4/2003 |
| JP | 2003-133929 A | 5/2003 |
| JP | 2004-282806 A | 10/2004 |

* cited by examiner

*Primary Examiner*—Lincoln Donovan
*Assistant Examiner*—Ryan C Jager
(74) *Attorney, Agent, or Firm*—Young Basile

(57) ABSTRACT

A drive circuit for driving a voltage-driven-type element including a gate terminal, an emitter terminal and a collector terminal includes a first semiconductor switch including an output terminal disposed between a power source for the drive circuit and the gate terminal, a first resistor disposed between the output terminal and the gate terminal and a capacitive element connected in parallel with the first semiconductor switch. The capacitive element supplies an external electric charge from the power source to a portion between the gate terminal and the emitter terminal after an internal electric charge accumulated in the portion between the gate terminal and the emitter terminal is supplied to a portion between the gate terminal and the collector terminal.

15 Claims, 3 Drawing Sheets

DRIVE CIRCUIT FOR VOLTAGE DRIVEN ELECTRONIC ELEMENT

CROSS-REFERENCE TO RELATED APPLICATIONS

This application claims priority from Japanese Patent Application Serial No. 2007-153615, filed Jun. 11, 2007, which is incorporated herein in its entirety by reference.

TECHNICAL FIELD

The present invention relates to a drive circuit for driving a voltage-driven-type element adapted to be used for a switching circuit, an inverter circuit or the like provided in a unit such as an electric vehicle that needs high electric power.

BACKGROUND

In recent years, a voltage driven type element such as an insulated gate bipolar transistor (IGBT) has been used in a switching circuit or an inverter circuit employed in power control circuits for applications requiring high power. Japanese Patent Application Publication No. 2003-125574 discloses a switching circuit and inverter circuit that includes two series-connected IGBTs where each is connected with a freewheeling diode (FWD) in the form of an inverse-parallel connection. A reactor functioning as an inductive load is connected to the connection point of the IGBTs. The first IGBT (IGBT1) is connected to a direct-current voltage, the second IGBT (IGBT2) is connected to ground (GND), and a gate terminal of each IGBT is connected to a drive circuit. This drive circuit includes a push-pull transistor for charging/discharging the IGBT by means of an input of gate signal, a gate resistor connected between this transistor and the gate terminal of the IGBT, and an external capacitor connected between an emitter terminal of the IGBT and the gate resistor.

BRIEF SUMMARY

Disclosed herein are embodiments of a drive circuit for driving a voltage-driven element including a gate terminal, an emitter terminal and a collector terminal. One drive circuit comprises, for example, a first semiconductor switching element including an output terminal disposed between a power source for the drive circuit and the gate terminal, a first resistor disposed between the output terminal and the gate terminal and a capacitive element connected in parallel with the first semiconductor element and configured to supply an electric charge from the power source to a portion between the gate terminal and the emitter terminal after an electric charge accumulated in the portion between the gate terminal and the emitter terminal is supplied to a portion between the gate terminal and the collector terminal.

This embodiment and others are described hereinafter.

BRIEF DESCRIPTION OF THE DRAWINGS

The description herein makes reference to the accompanying drawings wherein like reference numerals refer to like parts throughout the several views, and wherein.

DETAILED DESCRIPTION OF EMBODIMENTS OF THE INVENTION

In the drive circuit shown in the aforementioned Japanese Patent Application Publication No. 2003-125574, an external capacitor injects electric charge to a gate-emitter capacitor whereby the external capacitor is located between the gate terminal and the emitter terminal of the IGBT2. Thus, the reduction of gate voltage is prevented, and the reduction of the gate charging speed is suppressed. Since a current amplification factor is not enlarged, a recovery current of the FWD is suppressed. The rate of decrease of the collector-emitter voltage is suppressed, and the loss during a reverse-transfer-capacitance charging process is reduced so that the reduction of a turn-on loss is achieved. However, it is necessary that the drive circuit use a large external capacitor when the gate-collector capacitor is large. If the external capacitor is made larger, gate charging time is increased as a whole, and consumption current from a power source for the drive circuit is increased so that the loss is increased.

In contrast, embodiments of a drive circuit for driving a voltage-driven-type element of the invention illustrated in FIGS. 1-5 provide a drive circuit for driving a voltage-driven element that is capable of reducing the turn-on loss without enlarging a capacitor even when the gate-collector capacitor is large.

Figure 1:
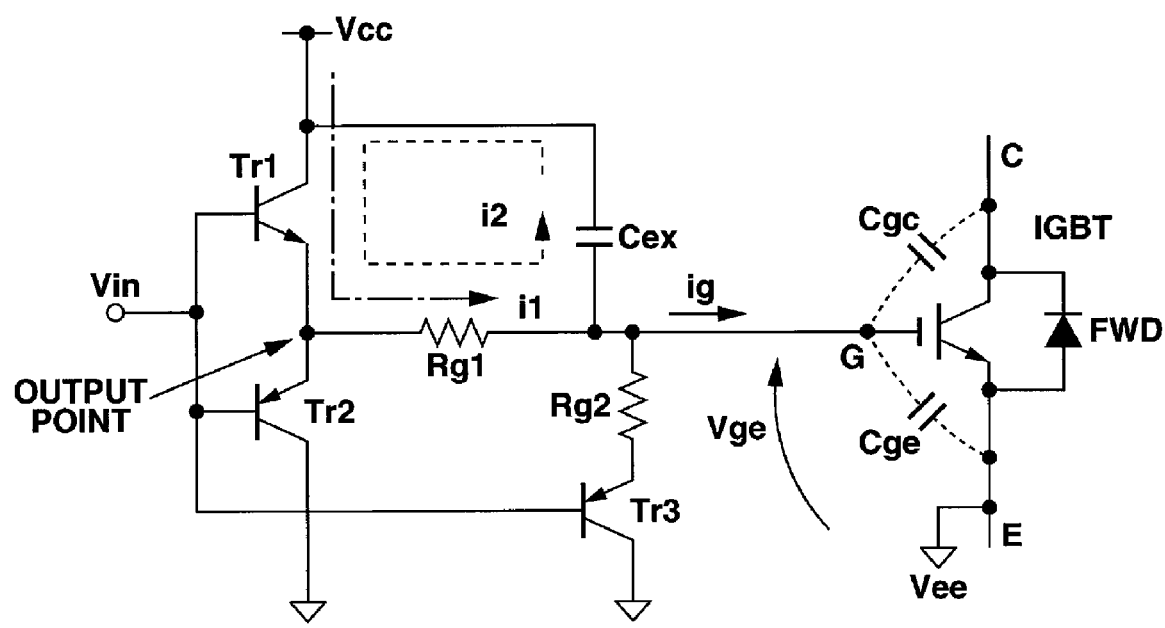
FIG. 1 is a circuit configuration diagram showing a drive circuit for driving a voltage-driven-type element according to a first embodiment of the invention.

FIG. 1 illustrates a first embodiment of the drive circuit. The drive circuit is connected to a voltage-driven-type element adapted to be used for a switching circuit, an inverter circuit or the like. The voltage-driven-type element may be an insulated gate bipolar transistor (IGBT), a MOSFET, a MOS thyristor or the like and is not limited to what is shown in the drawing figures. As depicted in FIG. 1, the voltage driven-type element is an IGBT. The drive circuit is connected to a gate terminal G of the IGBT. The IGBT is connected with a freewheeling diode (FWD) in the form of an inverse-parallel connection (back-to-back connection). Gate-emitter capacitance Cge exists between gate terminal G of the IGBT and an emitter terminal E of the IGBT, and gate-collector capacitance Cgc exists between gate terminal G and a collector terminal C. A reference electric potential Vee is applied to emitter terminal E.

The drive circuit according to the first embodiment includes a transistor Tr1 and a transistor Tr2 complementary to the transistor Tr1 and connected by their emitters at a common junction (shown as "output point" on FIG. 1). A gate resistor Rg1 is connected between the output point and gate terminal G of the IGBT and a condenser Cex. Condenser Cex includes a first conductor connected with a power source Vcc for the drive circuit at the collector terminal of transistor Tr1, a second conductor connected to a point between gate resistor Rg1 and gate terminal G and an insulator between the first conductor and the second conductor. Transistor Tr1 and transistor Tr2 form or define push-pull transistors for performing charging and discharging of the IGBT in accordance with an input of a gate signal Vin. Moreover, a transistor Tr3 and a current-limiting resistor Rg2 are connected between emitter terminal E and the point between gate resistor Rg1 and gate terminal G. More specifically, current-limiting resistor Rg2 is connected between the point between gate resistor Rg1 and gate terminal G and the emitter of transistor Tr3, which is in turn connected by its collector terminal to emitter terminal E through their common connection to reference potential Vee. Transistor Tr3 functions as a semiconductor element complementary to transistor Tr1. Gate (or base) terminals of transistor Tr1, transistor Tr2 and transistor Tr3 are connected to gate signal Vin. As mentioned above, power source Vcc is applied to the collector terminal of transistor Tr1. Finally, reference potential Vee is applied to collector terminals of transistor Tr2 and transistor Tr3. In the drive circuit according to the first embodiment, transistor Tr1 is a NPN transistor, and transistors Tr2 and Tr3 are PNP transistors.

With continued reference to FIG. 1, operations of the IGBT and the drive circuit according to the first embodiment of the invention are now explained. When gate signal Vin changes from high (HI) level to low (LO) level, transistor Tr1 makes a state transition from ON to OFF, and transistors Tr2 and Tr3, used for discharging a gate electric charge, make a state transition from OFF to ON. Thereby, the electric charge of gate-emitter capacitance Cge and the electric charge of gate-collector capacitance Cgc in the IGBT are discharged through transistor Tr3 and current-limiting resistor Rg2. Accordingly, a gate voltage Vge is reduced so that the IGBT makes a state transition from ON to OFF. At this time, a discharging current i2 flows from power source Vcc to condenser Cex (in a direction opposite to that for current i2 shown in FIG. 1), so that condenser Cex is charged.

Figure 2:
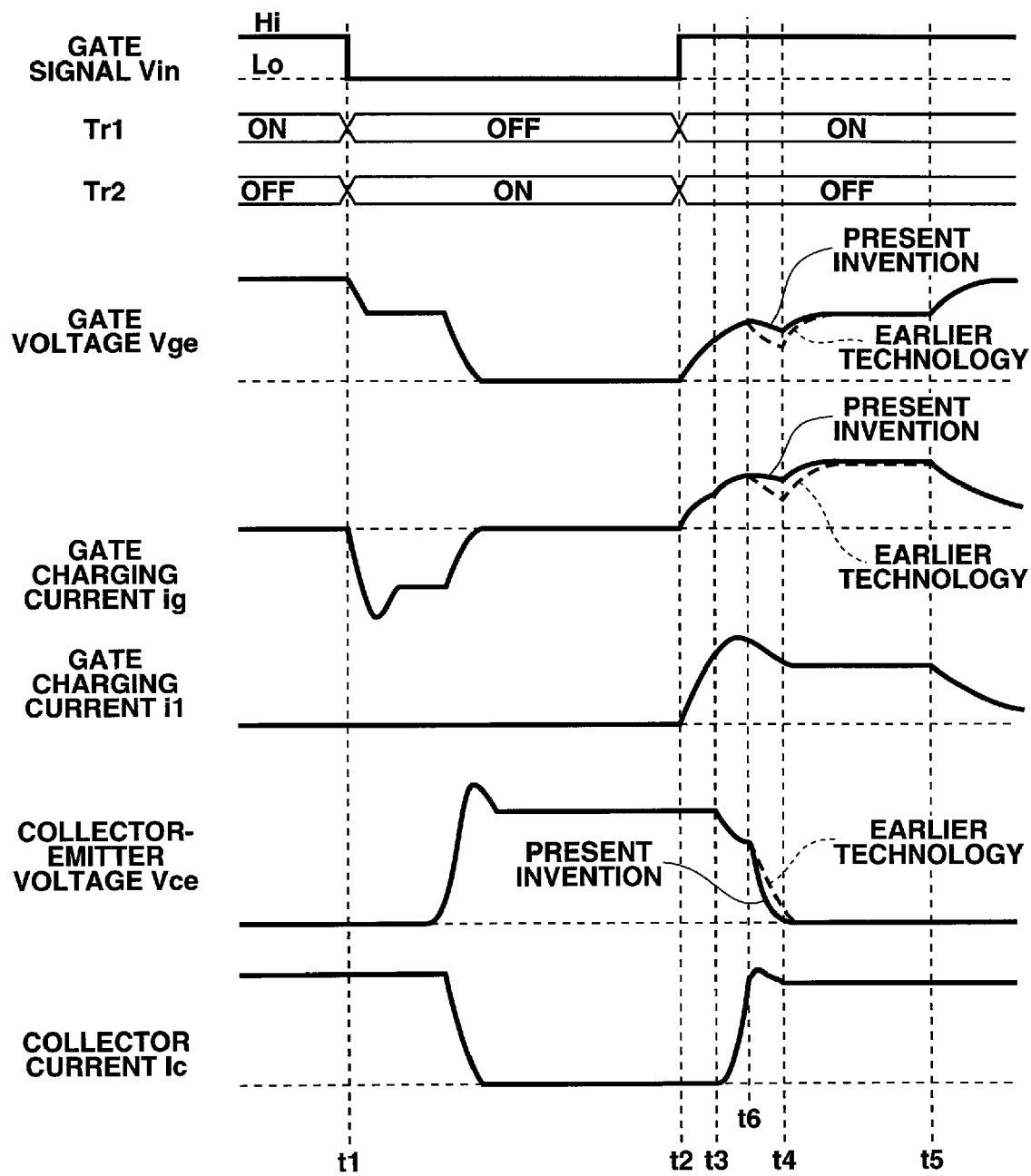
FIG. 2 is a time chart showing an operation of a device compared with the drive circuit in FIG. 1.

On the other hand, when gate signal Vin changes from LO level to HI level, transistor Tr1 makes a state transition from OFF to ON, and transistors Tr2 and Tr3, used for discharging the gate electric charge, make a state transition from ON to OFF. Thereby, a gate charging current i1 flows from power source Vcc to gate-emitter capacitance Cge so that gate-emitter capacitance Cge (a capacitor equivalent between the gate and emitter terminals) is charged. At the same time, the electric charge accumulated in condenser Cex is discharged through transistor Tr1 and gate resistor Rg1 to gate-emitter capacitance Cge in the same direction as shown by current i2 in FIG. 1. Thus, gate voltage Vge rises. When gate voltage Vge exceeds a threshold value, the IGBT starts to transition to the ON state, and a collector-emitter voltage Vce (voltage between the collector C and emitter E terminals) starts to decrease. In accordance with this decrease of collector-emitter voltage Vce, a collector current Ic of the IGBT increases as shown in FIG. 2. Then, when collector current Ic reaches a predetermined value, charging to gate-collector capacitance Cgc of the IGBT starts. At this time, the electric charge accumulated in gate-emitter capacitance Cge is discharged to gate-collector capacitance Cgc. This decrease in the electric charge of gate-emitter capacitance Cge serves to reduce gate voltage Vge. However, in the first embodiment, gate-emitter capacitance Cge is transiently charged by power source Vcc through condenser Cex by using a bypass of gate resistor Rg1 and final-stage transistor Tr1. Accordingly, the reduction of gate voltage Vge is suppressed. After starting the charging of gate-emitter capacitance Cge through condenser Cex from power source Vcc, collector-emitter voltage Vce is reduced so that the IGBT makes the state transition from OFF to ON.

FIG. 2 is a time chart of the circuit configuration diagram shown in FIG. 1. In the time chart, time point t1 represents when gate signal Vin changes from HI level to LO level, and time point t2 represents when gate signal Vin changes from LO level to HI level. Moreover, time point t3 represents when collector-emitter voltage Vce begins to decrease, and time point t6 represents when gate-collector capacitance Cgc starts to charge. Time point t4 represents when the drop of collector-emitter voltage Vce ends, and time point t5 represents when gate voltage Vge starts to rise further after gate voltage Vge has been stabilized. A time period between time point t2 and time point t6 represents an initial charging process, and a time period after time point t6 represents a reverse-transfer-capacitance charging process.

Specifically, the initial charging process means the time period when the gate signal becomes HI and allows for the start of charging gate-emitter capacitance Cge of the IGBT. Then, collector-emitter voltage Vce of the IGBT starts to drop in response to gate voltage Vge brought in excess of its threshold value, and collector current Ic of the IGBT increases according to this drop so that the charging of gate-collector capacitance Cgc of the IGBT begins. Namely, the beginning and ending of the above events define the period of the initial charging process.

On the other hand, the reverse-transfer-capacitance charging process means the time period when collector current Ic reaches its maximum value after the initial charging process (i.e., after starting to charge gate-collector capacitance Cgc, which is a reverse transfer capacitance), and then the charging for gate-collector capacitance Cgc and gate-emitter capacitance Cge finishes. Namely, the beginning and ending of the above events define the period of the reverse-transfer-capacitance charging process.

As mentioned previously, at time point t1, transistors Tr2 and Tr3 change from an OFF state to an ON state. As a result, the electric charge of gate-emitter capacitance Cge and the electric charge of gate-collector capacitance Cgc are discharged through transistor Tr3 and current-limiting resistor Rg2. Accordingly, a gate charging current ig has negative values. Afterward, the IGBT changes its state from ON to OFF in response to the reduction of gate voltage Vge. Namely, collector-emitter voltage Vce increases, collector current Ic decreases to 0 A, and the IGBT is turned off.

At time point t2, transistor Tr1 changes its state from OFF to ON, as mentioned previously. Accordingly, gate charging current i1 starts to flow from power source Vcc to gate-emitter capacitance Cge, and discharging current i2 starts to flow from condenser Cex to gate-emitter capacitance Cge in the direction of arrow shown in FIG. 1. Accordingly, gate voltage Vge starts to rise. Afterward, at time point t3, gate voltage Vge rises above a threshold value so that the IGBT makes the state transition from OFF to ON. Namely, collector-emitter voltage Vce starts to drop, and collector current Ic of the IGBT starts to rise. As shown in FIG. 2, gate voltage Vge continues to rise until time point t6. Here, gate voltage Vge(t) between time points t2 and t6 can be calculated approximately by the following equation:

$$Vge(t)=Vcc*\{1-\exp(-t/\tau)\}; \text{ wherein} \qquad (1)$$

t is any time point given between time points t2 and t6; and time constant $\tau=Rg1*(Cex+Cge)$. Where t=0 at time point t2, then $0 \leq t \leq t6-t2$).

As mentioned previously, at time point t6, charging of gate-collector capacitance Cgc starts. At this time, the electric charge accumulated in gate-emitter capacitance Cge is discharged to gate-collector capacitance Cgc. Namely, a value of gate voltage Vge just after time point t6 is represented by equation (4) for Vge1, which results from the addition of equation (2) for Vge0 and equation (3) for ΔVge(t). Vge0 is an initial value of gate voltage Vge, which is derived from an energy conservation equation based on the electric charge accumulated in gate-emitter capacitance Cge until a moment just before time point t6 discharged to gate-collector capacitance Cgc as shown next:

$$(Cge+Cgc)*(Vge0)^2/2 = Cge*\{Vge(t6)\}^2/2 \text{ becomes}$$
$$Vge0 = \sqrt{\{Cge/(Cge+Cgc)\}} * Vge(t6); \text{ wherein} \quad (2)$$

Vge(t6) represents a value of gate voltage Vge just before time point t6. Equation (3) is as follows:

$$\Delta Vge(t) = Vcc*\{1-\exp(-t/\tau 1)\}; \text{ wherein} \quad (3)$$

time constant $\tau 1 = Z(Cex)*(Cge+Cgc)$; and impedance $Z(Cex)=1/\{2\pi\sqrt{(f*c)}\}$. Where t=0 at time point t6, then $0 \leq t \leq t4-t6$. Equation (4) is as follows:

$$Vge1 = Vge0 + \Delta Vge(t). \quad (4)$$

Equation (4) gives the value of gate voltage Vge just after time point t6 and shows that gate-emitter capacitance Cge is charged with impedance Z(Cex) from power source Vcc through condenser Cex by using the bypass of gate resistor Rg1 and transistor Tr1 instantaneously after the electric charge accumulated in gate-emitter capacitance Cge is discharged to gate-collector capacitance Cgc. Here, $\Delta Vge(t)$ shown in equation (3) is a voltage rising amount because of the bypass current that flows from power source Vcc through condenser Cex to gate-emitter capacitance Cge by passing the bypass of gate resistor Rg1 and final-stage transistor Tr1 in order to charge gate-emitter capacitance Cge.

In the case of earlier technology such as that described initially, an impedance of transistor Tr1 and gate resistor Rg1 is higher than an impedance of gate-emitter capacitance Cge. Hence, power source Vcc cannot efficiently charge gate-collector capacitance Cgc, which means that gate charging current ig decreases during the period between time points t6 and t4 (dotted line). Meanwhile, the electric charge accumulated in gate-emitter capacitance Cge up to just before time point t6 is discharged to gate-collector capacitance Cgc. Moreover, the electric charge accumulated in condenser Cex up to just before time point t6 is discharged to gate-emitter capacitance Cge and gate-collector capacitance Cgc. Therefore, in the earlier technology, gate voltage Vge is reduced during the period between time points t6 and t4 (dotted line).

Accordingly, a value of gate voltage Vge just after time point t6 in the earlier technology is given approximately by a Vge0' shown in the following equation (5), which is derived from an energy conservation equation:

$$Vge0' = \sqrt{\{(Cex+Cge)/(Cex+Cge+Cgc)\}} * Vge(t6)'; \text{ wherein} \quad (5)$$

Vge(t6)' represents a value of gate voltage Vge just before time point t6 in the earlier technology.

When comparing gate voltage Vge (solid line) according to the first embodiment of the invention with gate voltage Vge (dotted line) of the earlier technology during the period between time points t6 and t4, the earlier technology appears to suppress the decrease in gate voltage Vge if only equations (2) and (5) are compared. However, in this embodiment of the invention, the decrease of gate voltage Vge is greatly suppressed by the effect of equation (3). Accordingly, as shown by gate charging current ig (solid line) between time points t6 and t4 in FIG. 2, gate charging current ig (solid line) according to the teachings herein is larger than that in the earlier technology. The reason that gate charging current ig is larger than gate charging current of the earlier technology is because bypass current flows from power source Vcc through condenser Cex, bypassing transistor Tr1 and gate resistor Rg1, in order to charge gate-emitter capacitance Cge. As shown by $\Delta Vge(t)$ in equation (3), a voltage rising amount produced by this bypass current allows gate voltage Vge to drop less than the earlier technology.

Specifically, for example, gate voltage Vge at time point t4 in the earlier technology gives Vge0'=$\sqrt{(3/4)}$*6≈5.2 V when gate-emitter capacitance Cge=0.01 µF, gate-collector capacitance Cgc=0.01 µF, condenser Cex=0.02 µF, and the gate voltage Vge(t6)' just before time point t6=6 V. On the other hand, initial value Vge0 of gate voltage Vge according to the present embodiment of the invention is calculated as Vge0=$\sqrt{(1/2)}$*6≈4.3 V. Voltage rising amount $\Delta Vge(t)$ due to the bypass current from condenser Cex in the present embodiment is calculated as $\Delta Vge(1 \text{ ns})$=16*{1−exp(−1 n/2.25 n)}≈5.4 V when Vcc=16 V, the time period t between time points t6 and t4 is 1 ns, and Z(Cex)=0.1Ω. Therefore, gate voltage Vge1 at time point t4 is calculated as Vge1≈4.3 V+5.4 V=9.7 V, which is greater than the value of Vge0' of 5.2 V. Thus, this embodiment of the invention prevents decreases in gate voltage Vge. Without being bound to theory, it is thought that the effect according to the first embodiment of the invention is reduced in some degree due to an existence of wiring impedance.

At time point t4, the dropping of collector-emitter voltage Vce is finished, and the IGBT is turned on. Gate voltage Vge(t) at any time point t after time point t4 can be given approximately by the following equation:

$$Vge(t) = Vcc*\{1-\exp(-t/\tau 2)\}; \text{ wherein} \quad (6)$$

time constant $\tau 2 = Rg1*(Cex+Cge+Cgc(t))$; and

Cgc(t) is a time variable value of capacitance for Cgc. Where t=0 at time point t4, then $0 \leq t \leq t5-t4$.

At time point t5, gate voltage Vge increases more than that of earlier technology because of the effect of voltage rising amount $\Delta Vge(t)$ shown in equation (3) in response to the variation of gate-collector capacitance Cgc.

As explained above, in the case where the impedance of transistor Tr1 and gate resistor Rg1 is increased as compared with the impedance of gate-emitter capacitance Cge so as not to enlarge a current amplification factor in order to suppress a recovery current of the FWD, gate voltage Vge is reduced during the charging time period (from t6 to t4) of gate-collector capacitance Cgc because the electric charge accumulated in gate-emitter capacitance Cge is discharged to gate-collector capacitance Cgc. However, according to the present embodiment, gate-emitter capacitance Cge is transiently charged from power source Vcc through condenser Cex by using the bypass of gate resistor Rg1 and transistor Tr1, so that the reduction of gate voltage Vge can be suppressed. Therefore, the reduction of a gate charging speed, namely the lessening of a dropping speed of collector-emitter voltage Vce caused by the reduction of gate voltage Vge during the charging of gate-collector capacitance Cgc, can be suppressed. Hence, a loss during the reverse-transfer-capacitance charging process can be further reduced, and a turn-on loss can be further reduced. Accordingly, without enlarging condenser Cex and without enlarging the current amplification factor even in the case where gate-collector capacitance Cgc is large, the rate that collector-emitter voltage Vce decreases can be suppressed so that the turn-on loss can be reduced.

Figure 3:
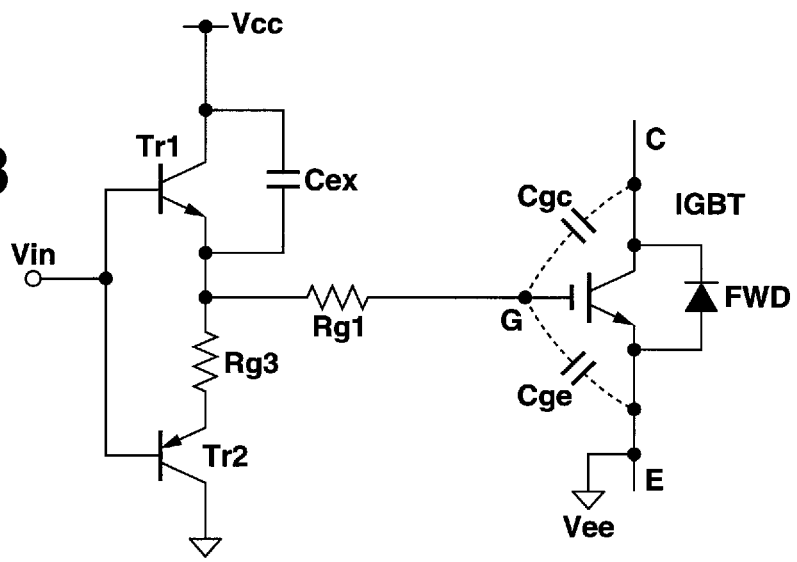
FIG. 3 is a circuit configuration diagram showing a drive circuit for driving a voltage-driven-type element according to a second embodiment of the invention.

A drive circuit for driving a voltage-driven-type element according to a second embodiment is shown in FIG. 3. The drive circuit of the present embodiment is similar to the drive circuit of the first embodiment so duplicative descriptions are omitted.

Figure 4:
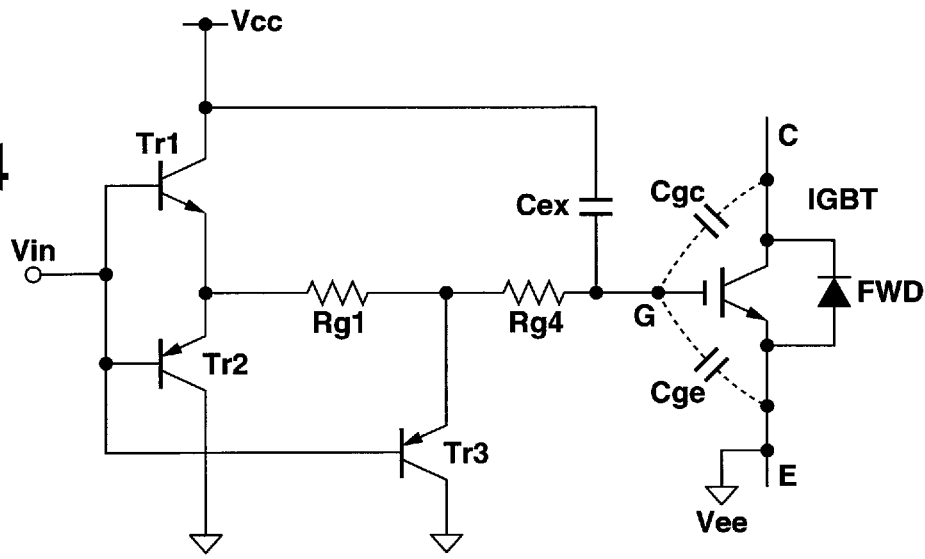
FIG. 4 is a circuit configuration diagram showing a drive circuit for driving a voltage-driven-type element according to a third embodiment of the invention.

The drive circuit according to the second embodiment includes transistor Tr1, transistor Tr2, gate resistor Rg1 connected between the output point (emitter) of transistor Tr1 and gate terminal G of the IGBT, a FWD connected to the IGBT in the form of an inverse-parallel connection, a current-limiting resistor Rg3 connected between transistor Tr1 and transistor Tr2, and condenser Cex. Gate terminals of transistor Tr1 and transistor Tr2 are connected to gate signal Vin. Power source Vcc is applied to the collector terminal of transistor Tr1, and reference potential Vee is applied to the collector terminal of transistor Tr2. One side of condenser Cex is connected with power source Vcc, and the other side of condenser Cex is connected between gate resistor Rg1 and the emitter of transistor Tr1. Current-limiting resistor Rg3 is connected between the emitters of transistor Tr1 and transistor Tr2, and gate resistor Rg1 is connected with condenser Cex at the output point (emitter) of transistor Tr1. Thus, the electric charge accumulated in gate-emitter capacitance Cge and gate-collector capacitance Cgc is discharged through transistor Tr2, gate resistor Rg1 and current-limiting resistor Rg3 by changing the state of transistor Tr2 from OFF to ON. Moreover, when charging gate-collector capacitance Cgc, the electric charge accumulated in gate-emitter capacitance Cge is discharged to gate-collector capacitance Cgc so that gate voltage Vge is reduced. However, gate-emitter capacitance Cge is transiently charged from power source Vcc through condenser Cex and gate resistor Rg1 by using the bypass of transistor Tr1. Therefore, drive circuit of the second embodiment can obtain similar results as in the first embodiment A drive circuit for driving a voltage-driven-type element according to a third embodiment is shown in FIG. 4. The drive circuit of the present embodiment is similar to the drive circuit of the first embodiment so duplicative descriptions are omitted.

Figure 5:
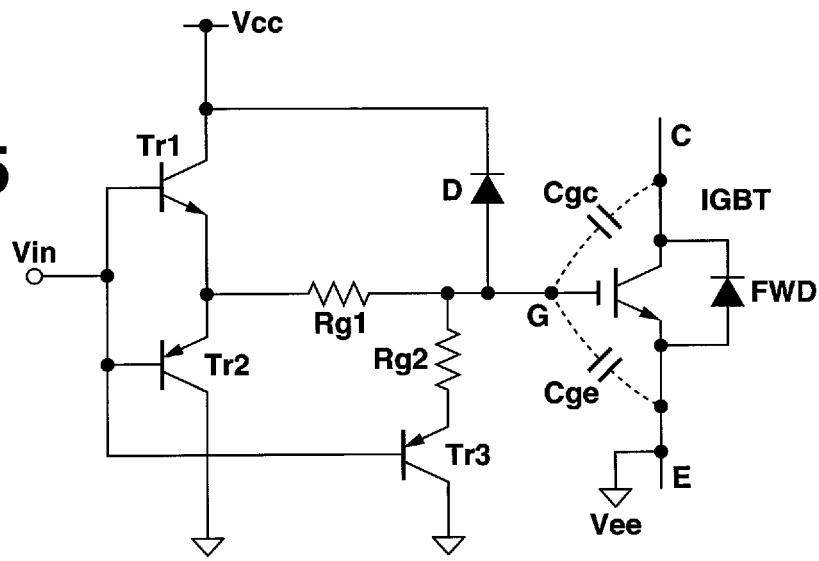
FIG. 5 is a circuit configuration diagram showing a drive circuit for driving a voltage-driven-type element according to a fourth embodiment of the invention.

The drive circuit according to the third embodiment includes transistor Tr1. In addition, gate resistor Rg1 and a current-limiting resistor Rg4 are connected in series between the output point (emitter) of transistor Tr1 and gate terminal G of the IGBT. A FWD is connected to the IGBT in the form of an inverse-parallel connection. A transistor Tr3 is connected between emitter terminal E of the IGBT and a connection point between gate resistor Rg1 and current-limiting resistor Rg4. The third embodiment also includes transistor Tr2 and condenser Cex. Gate terminals of transistor Tr1, transistor Tr2 and transistor Tr3 are connected to gate signal Vin. Power source Vcc is applied to the collector terminal of transistor Tr1, and reference potential Vee is applied to the collector terminals of transistor Tr2 and transistor Tr3, in addition to the emitter terminal E of the IGBT. One side of condenser Cex is connected with power source Vcc at the collector of transistor Tr1, and the other side of condenser Cex is connected between current-limiting resistor Rg4 and gate terminal G. Current-limiting resistor Rg4 is connected between a common junction of gate resistor Rg1 and the emitter of transistor Tr3 and gate terminal G. Thus, the electric charge accumulated in gate-emitter capacitance Cge and gate-collector capacitance Cgc is discharged through transistor Tr3 and current-limiting resistor Rg4 by changing the state of transistor Tr3 from OFF to ON. Moreover, when charging gate-collector capacitance Cgc, the electric charge accumulated in gate-emitter capacitance Cge is discharged to gate-collector capacitance Cgc so that gate voltage Vge is reduced. However, gate-emitter capacitance Cge is transiently charged from power source Vcc through condenser Cex by using the bypass of transistor Tr1, gate resistor Rg1 and current-limiting resistor Rg4. Therefore, drive circuit of the third embodiment can obtain similar results as in the first embodiment A drive circuit for driving a voltage-driven-type element according to a fourth embodiment is shown in FIG. 5. The drive circuit of the present embodiment is similar to the drive circuit of the first embodiment so duplicative descriptions are omitted.

The drive circuit according to the fourth embodiment includes transistor Tr1, gate resistor Rg1 connected between the output point (emitter) of transistor Tr1 and gate terminal G of the IGBT and a FWD connected to the IGBT in the form of an inverse-parallel connection. A transistor Tr3 and current-limiting resistor Rg2 are connected between emitter terminal E and a point between gate resistor Rg1 and gate terminal G. The fourth embodiment also includes a transistor Tr2 and a diode D. Gate terminals of transistor Tr1, transistor Tr2 and transistor Tr3 are connected to gate signal Vin. Power source Vcc is applied to the collector terminal of transistor Tr1, and reference potential Vee is applied to the collector terminals of transistor Tr2 and transistor Tr3, in addition to the emitter terminal E of the IGBT. The cathode of diode D is connected with power source Vcc, and the anode of diode D is coupled to a common junction of current-limiting resistor Rg2, gate resistor Rg1 and gate terminal G. In contrast to the first embodiment, diode D is provided instead of condenser Cex. Thus, when charging gate-collector capacitance Cgc, the electric charge accumulated in gate-emitter capacitance Cge is discharged to gate-collector capacitance Cgc so that gate voltage Vge is reduced. However, gate-emitter capacitance Cge is transiently charged from power source Vcc through a depletion capacitance of diode D by using the bypass of transistor Tr1 and gate resistor Rg1. Therefore, drive circuit of the fourth embodiment can obtain similar results as in the first embodiment.

The above-described embodiments are examples for carrying out the invention. The scope of the invention is not limited to these embodiments, and the invention is applicable to the other various embodiments within the scope defined by the claims. For example, one gate resistor Rg1 is provided in the drive circuit for driving a voltage-driven-type element in each of the first to fourth embodiments. However, the number of gate resistors Rg1 is not limited to one, and a plurality of gate resistors Rg1 may be provided.

Moreover, in the drive circuit according to the fourth embodiment, condenser Cex of the drive circuit in the first embodiment is replaced with diode D. However, replacing capacitor Cex within diode D is not limited to the fourth embodiment, and it is within the scope of the invention to provide, a circuit configuration in which condenser Cex of the drive circuit according to the second or third embodiment is replaced with diode D.

Accordingly, the above-described embodiments have been described in order to allow understanding of the invention and do not limit the invention. On the contrary, the invention is intended to cover various modifications and equivalent arrangements included within the scope of the appended claims, which scope is to be accorded the broadest interpretation so as to encompass all such modifications and equivalent structure as is permitted under the law.

What is claimed is:

1. A drive circuit for driving a voltage-driven element including a gate terminal, an emitter terminal and a collector terminal, the drive circuit comprising:
    a first semiconductor switching element including a first terminal coupled to a signal source for the drive circuit, a second terminal coupled to a power source for the drive circuit and an output terminal coupled to an output point;
    a second semiconductor switching element complementary to the first semiconductor switching element and including a first terminal coupled to the signal source for the drive circuit, a second terminal coupled with the emitter terminal at a common potential and an output terminal coupled directly or indirectly to the output point;

a third semiconductor switching element complementary to the first semiconductor switching element and including a first terminal coupled to the signal source for the drive circuit, a second terminal coupled with the emitter terminal at the common potential and an output terminal coupled directly or indirectly to the output point;

a freewheeling diode coupled between the collector terminal and the emitter terminal;

a first resistor disposed between the output point and the gate terminal; and a capacitive element having a first terminal coupled to a junction of the power source and the second terminal of the first semiconductor switching element and having a second terminal coupled to a point between the output terminal of the first semiconductor switching element and the gate terminal, the capacitive element supplying an electric charge from the power source to a portion between the gate terminal and the emitter terminal after an electric charge accumulated in the portion between the gate terminal and the emitter terminal is supplied to a portion between the gate terminal and the collector terminal.

2. The drive circuit according to claim 1 wherein the capacitive element comprises:

a first conductor forming the first terminal;

a second conductor forming the second terminal; and an insulator provided between the first conductor and the second conductor.

3. The drive circuit according to claim 2 wherein the second conductor is connected at a point between the first resistor and the gate terminal.

4. The drive circuit according to claim 3, further comprising:

a second resistor; and wherein the second resistor is disposed between the first resistor, the gate terminal and the emitter terminal.

5. The drive circuit according to claim 4 wherein the second resistor is connected in series between the first resistor and a junction of the second conductor and the gate terminal; and the output terminal of the second semiconductor switching element is coupled to a junction of the first resistor and the second resistor.

6. The drive circuit according to claim 4 wherein the second resistor is connected between the output terminal of the second semiconductor switching element and a junction of the first resistor, the second conductor and the gate terminal.

7. The drive circuit according to claim 1 wherein the capacitive element includes a semiconductor component including an anode and a cathode, the cathode located at the first terminal of the capacitive element and the anode located at the second terminal of the capacitive element.

8. The drive circuit according to claim 7 wherein the cathode is connected to the junction of the power source and the second terminal of the first semiconductor switching element and the anode is connected between the first resistor and the gate terminal.

9. The drive circuit according to claim 8, further comprising:

a second resistor, the second semiconductor switching element and the second resistor disposed between the first resistor, the gate terminal and the emitter terminal.

10. The drive circuit according to claim 9 wherein the second resistor is connected in series between the first resistor and a junction of the anode and the gate terminal; and the output terminal of the second semiconductor switching element is coupled to a junction of the first resistor and the second resistor.

11. The drive circuit according to claim 9 wherein the second resistor is connected between the output terminal of the second semiconductor switching element and a junction of the first resistor, the anode and the gate terminal.

12. The drive circuit according to claim 1, further comprising:

a second resistor;

wherein the output terminal of the second semiconductor switching element is directly coupled to the output point; and wherein the second resistor is connected in series between the first resistor and a junction of the second conductor and the gate terminal; and the output terminal of the third semiconductor switching element is coupled to a junction of the first resistor and the second resistor.

13. The drive circuit according to claim 1, further comprising:

a second resistor;

wherein the output terminal of the second semiconductor switching element is directly coupled to the output point; and wherein the second resistor is connected between the output terminal of the third semiconductor switching element and a junction of the first resistor, the second conductor and the gate terminal.

14. A drive circuit for driving a voltage-driven element including a gate terminal, an emitter terminal and a collector terminal, the drive circuit comprising:

first means for switching from an on conduction state to an off conduction state and including a first terminal coupled to a signal source for the drive circuit, a second terminal coupled to a power source for the drive circuit and an output terminal coupled to an output point;

second means for switching from an on conduction state to an off conduction state complementary to the first means for switching and including a first terminal coupled to the signal source for the drive circuit, a second terminal coupled with the emitter terminal at a common potential and an output terminal coupled directly or indirectly to the output point;

third means for switching from an on conduction state to an off conduction state complementary to the first means for switching and including a first terminal coupled to the signal source for the drive circuit, a second terminal coupled with the emitter terminal at the common potential and an output terminal coupled directly or indirectly to the output point;

a freewheeling diode coupled between the collector terminal and the emitter terminal;

a first resistor disposed between the output point and the gate terminal; and capacitive means for supplying an electric charge from the power source to a portion between the gate terminal and the emitter terminal after an electric charge accumulated in the portion between the gate terminal and the emitter terminal is supplied to a portion between the gate terminal and the collector terminal due to switching of the first means for switching, the capacitive means having a first terminal coupled to a junction of the power source and the second terminal of the first semiconductor switching element and having a second terminal coupled to a point between the output terminal of the first semiconductor switching element and the gate terminal.

15. A method for driving a voltage-driven element including a gate terminal, an emitter terminal and a collector terminal, the drive method comprising:

supplying electric power to the voltage-driven element using a first semiconductor switching element including a first terminal coupled to a signal source for the drive circuit, a second terminal coupled to a power source for the drive circuit and an output terminal coupled to an output point and a resistor disposed between the output point and the gate terminal, a freewheeling diode coupled between the collector terminal and the emitter terminal;

supplying electric power to the voltage-driven element using a second semiconductor switching element complementary to the first semiconductor switching element and including a first terminal coupled to the signal source for the drive circuit, a second terminal coupled with the emitter terminal at a common potential and an output terminal coupled directly or indirectly to the output point;

discharging a gate electric charge of the voltage-driven element using a third semiconductor switching element complementary to the first semiconductor switching element and including a first terminal coupled to the signal source for the drive circuit, a second terminal coupled with the emitter terminal at the common potential and an output terminal coupled directly or indirectly to the output point; and supplying an electric charge from the power source through a capacitive element to a portion between the gate terminal and the emitter terminal after supplying an electric charge accumulated in the portion between the gate terminal and the emitter terminal to a portion between the gate terminal and the collector terminal, the capacitive element having a first terminal coupled to a junction of the power source and the second terminal of the first semiconductor switching element and having a second terminal coupled to a point between the output terminal of the first semiconductor switching element and the gate terminal.

* * * * *